(12) United States Patent
Kim

(10) Patent No.: US 7,351,633 B2
(45) Date of Patent: Apr. 1, 2008

(54) METHOD OF FABRICATING SEMICONDUCTOR DEVICE USING SELECTIVE EPITAXIAL GROWTH

(75) Inventor: Jun-Seuck Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 101 days.

(21) Appl. No.: 11/450,412

(22) Filed: Jun. 12, 2006

(65) Prior Publication Data
US 2007/0020892 A1 Jan. 25, 2007

(30) Foreign Application Priority Data
Jul. 5, 2005 (KR) .................. 10-2005-0060247

(51) Int. Cl.
*H01L 21/8238* (2006.01)
(52) U.S. Cl. .................. 438/222; 438/44; 438/360; 438/429; 257/E21.562
(58) Field of Classification Search ............. 438/41, 438/44, 222, 245, 269, 360, 388, 429; 257/E21.092, 257/E21.461, E21.562
See application file for complete search history.

(56) References Cited

U.S. PATENT DOCUMENTS

| 4,840,816 A | | 6/1989 | Appleton et al. | |
|---|---|---|---|---|
| 5,073,516 A | * | 12/1991 | Moslehi | 438/429 |
| 2007/0166963 A1 | * | 7/2007 | Son et al. | 438/482 |

* cited by examiner

*Primary Examiner*—Michael Lebentritt
*Assistant Examiner*—Cheung Lee
(74) *Attorney, Agent, or Firm*—Volentine & Whitt, PLLC

(57) ABSTRACT

A method of fabricating a semiconductor device using selective epitaxial growth (SEG) is disclosed. The method comprises; forming a seed window exposing a portion of a substrate through an interlayer insulating layer, growing a single crystal silicon SEG layer in the seed window using the exposed portion of the substrate as a seed, depositing an amorphous silicon layer on the interlayer insulating layer and in contact with the SEG layer, and performing an annealing process on the amorphous silicon layer over an annealing interval, and during the annealing interval applying microwave energy to the amorphous silicon layer.

14 Claims, 10 Drawing Sheets

METHOD OF FABRICATING SEMICONDUCTOR DEVICE USING SELECTIVE EPITAXIAL GROWTH

BACKGROUND OF THE INVENTION

1. Technical Field

Embodiments of the invention relate to a method of fabricating a semiconductor device. More particularly, embodiments of the invention relate to a method of fabricating a semiconductor device using selective epitaxial growth.

This application claims the benefit of Korean Patent Application No. 10-2005-0060247, filed Jul. 5, 2005, the disclosure of which is hereby incorporated by reference in its entirety.

2. Discussion of Related Art

Contemporary semiconductor devices are fabricated on a substrate through the application of a complex sequence of processes. Among these fabrication processes, epitaxial processes are increasingly used to form various elements, such as trench type isolation regions, plug contacts connecting source and drain regions, etc. In one particular application, one or more epitaxial processes may be used during the fabrication of SRAM devices having a stacked structure (e.g., two or more transistors stacked along a common vertical axis).

The term "epitaxial" generally refers to any process in which a material layer transition occurs along one or more crystalline axes. As is well known in the art, certain materials, including semiconductor and semi-insulating materials, may be used in conjunction with an epitaxial process. In one common application, an epitaxial process is used to grow a single crystal layer having defined "orientation" (e.g., an atomic lattice geometry) on a semiconductor substrate. The semiconductor substrate, or a material layer formed on the substrate imparts the defined orientation to a material layer grown by the epitaxial process. The growth of single crystal silicon on a silicon semiconductor substrate is a common object of conventional epitaxial processes.

Epitaxial processes have many benefits including the growth of very pure (e.g., contamination and defect free) material layers. In many instances, such material layers may also be grown at temperatures much lower than competing fabrication processes.

Epitaxial processes may be generally classified into three types in relation to their principle method of deposition; vapor phase epitaxy (VPE), liquid phase epitaxy (LPE), and molecular beam epitaxy (MBE). VPE is characterized by the use of a process gas to grow a material layer. LPE is characterized by the use of a saturated solution or molten source to grow a material layer. MBE is characterized by the use evaporated materials in an ultra-high vacuum state (e.g., a vacuum ranging from 9 to 10 Torr) and application of an energy beam to grow a material layer.

Selective epitaxial growth (SEG) is one class of epitaxial processes well adapted to the growth of a single crystal layer on only selected portion(s) of a semiconductor substrate. SEG typically involves segregation of a substrate surface, potentially having intervening structures formed thereon, into regions to be reacted (i.e., wherein the desired material layer will be grown using SEG) and regions not to be reacted. For example, in a region where an epitaxial layer is to be grown, the surface of the constituent semiconductor substrate may be selectively exposed by removing an intervening protective layer, such as silicon oxide using conventional photo-lithography and etching processes. The exposed portion of the substrate surface from which the desired material is grown and from which the desired material layer receives its crystalline orientation is referred to as a "seed" layer (or alternatively seed material, etc.). For example, U.S. Pat. No. 5,843,826, the subject matter of which is incorporated by reference, discloses an exemplary SEG process adapted to solve problems associated with etch margin as it relates to contact holes when source and drain regions are formed at a shallow depth.

In FIGS. 1A to 1C, a conventional method of fabricating a semiconductor device having a single stack layer using SEG is shown.

First, referring to FIG. 1A, a semiconductor substrate 10, for example of P type, comprises active and field regions defined by a trench isolation layer 12, and a gate region 14 having sidewall spacers 16. Penta-valent dopant ions have been selectively implanted into regions of semiconductor substrate 10 peripheral to gate region 14 to form doped diffusion regions serving as source and drain regions.

Subsequently, a buffer layer 18 (e.g., silicon nitride) and an oxide layer 20 (e.g., a high temperature oxide) are sequentially deposited on semiconductor substrate 10 to thicknesses of about 200 Å and 600 Å respectively to form an interlayer insulating layer. A seed window 22 exposing a source or drain region in semiconductor 10 is formed using a conventional photo-lithography process. The seed portion of semiconductor substrate 10 exposed through seed window 22 is subjected to an SEG process at a pressure ranging from between about 5 to 200 Torr at a temperature ranging from between about 700 to 750° C. As a result, a SEG layer 24 of single crystal silicon material similar to semiconductor substrate 10 is epitaxially grown in seed window 22.

Referring now to FIG. 1B, in order to continue the particular (and exemplary) SEG process associated with SEG layer 24, an amorphous silicon layer is deposited and patterned on semiconductor substrate 10 to contact SEG layer 24 to a thickness of about 250 Å. Once formed and patterned, the amorphous silicon layer acts as a channel silicon pattern 26. Channel silicon pattern 26 is a region adapted to receive a gate region associated with an upper transistor ultimately stacked on top of a lower transistor associated with gate region 14.

Referring to FIG. 1C, an annealing process 28 is performed on semiconductor substrate 10. In relation to the illustrated example, annealing process 28 is carried out at a temperature of about 600° C. for about 12 hours (e.g., an annealing interval). As a result of annealing process 28, SEG layer 24 acts as a seed for the growth of single crystal silicon (26a) from the patterned amorphous silicon layer forming channel silicon pattern 26. Single crystal silicon layer 26a is materially similar to SEG layer 24.

Subsequently, single crystal silicon layer 26a may be formed into a gate region having sidewall spacers as well as associated dopant diffusion regions functioning as source and drain regions in order to form the upper transistor.

The method illustrated in FIGS. 1A to 1C is drawn to an example of fabricating a SRAM having a single stack layer structure in view of contemporary design rules. In one aspect, this conventional method is advantageous in that it is capable of forming a channel silicon pattern on a desired region by forming an amorphous silicon layer into a single crystal layer using SEG layer 24 formed through seed window 22.

The constituent annealing process performed on the amorphous silicon layer is a heat treatment process adapted to rearrange silicon atoms in the amorphous silicon layer and thereby repair defects caused by ion implantation and other processes. In effect, the applied heat treatment re-arranges the silicon atoms to yield a silicon layer having an essentially uniform material lattice structure formed with a consistent orientation, or a "single crystal silicon layer."

One measure of lattice structure uniformity is the distance between neighboring atoms along a given orientation. Exemplary distances are shown in Table 1 for various material layer types (e.g., poly-types) and standard crystalline orientations.

TABLE 1

|        | Simple Cubic Structure | Body Centered Cubic Structure | Face Centered Cubic Structure | Diamond Structure |
|--------|------------------------|-------------------------------|-------------------------------|-------------------|
| <100>  | a                      | a                             | a                             | a                 |
| <110>  | $\sqrt{2}a$            | $\sqrt{2}a$                   | $\dfrac{a}{\sqrt{2}}$         | $\dfrac{a}{\sqrt{2}}$ |
| <111>  | $\sqrt{3}a$            | $\dfrac{\sqrt{3}a}{2}$        | $\sqrt{3}a$                   | $\dfrac{\sqrt{3}a}{4}$ & $\dfrac{3\sqrt{3}a}{4}$ |

As shown in Table 1, the distance between the neighboring atoms varies according to crystalline orientation, as defined by the Miller index. For example, in the simple cubic structure of the silicon, the distance between the neighboring atoms is "a" for crystal orientation <100>, while the distance between the neighboring atoms is "$\sqrt{3}a$" for crystal orientation <111>. Further, in a diamond structure of silicon, the distance between the neighboring atoms is "a" for crystal orientation <100>, while the distance between the neighboring atoms is $$\text{``}\dfrac{\sqrt{3}\,a}{4}\text{'' and ``}\dfrac{3\sqrt{3}\,a}{4}\text{''}$$

for crystal orientation <111>.

In a truly "single crystal silicon" material, the respective distances between neighboring atoms will be constant regardless of specific poly-type. However, in the amorphous silicon, the distance between the neighboring atoms is not constant due to its inherently irregular arrangement of silicon atoms. In order to convert the amorphous silicon into the single crystal silicon, the conventional annealing process is performed.

The process of converting amorphous silicon into single crystal silicon using an annealing process is further illustrated in FIGS. 2A to 2C.

Referring to FIG. 2A, an amorphous silicon layer 52 is formed on a single crystal silicon layer 50. In order to convert amorphous silicon layer 52 into single crystal silicon layer 50, an annealing process using single crystal silicon layer 50 as a seed is carried out. In one embodiment, the annealing process is carried out at a temperature of about 600° C. Under the influence of the annealing process, amorphous silicon layer 52 is changed into a layer of polycrystalline silicon 56 comprising a plurality of large grain boundaries 54, as shown in FIG. 2B.

As the annealing process continues, the bonding force between the silicon atoms is weakened. As a result, amorphous silicon layer is changed into a single crystal silicon layer 58 having similar material properties as the seed-single crystal silicon layer 50. See, FIG. 2C.

As noted, the exemplary, conventional annealing process is performed at a temperature of about 600° C. This annealing temperature of 600° C. is relatively low, so that a mean free path of the silicon atom is short. Therefore, if the annealing process is not adequately performed, the amorphous silicon will not be completely converted into the single crystal silicon, and thus the amorphous silicon will coexist with the crystalline silicon (e.g., a resulting mixture of poly-crystal and single-crystal materials).

In order to avoid this result, it is typically preferable to maintain the annealing process for a sufficiently long time. Thus, the conventional SEG process described with reference to FIGS. 1A to 1C comprises an annealing process that applies a temperature of about 600° C. for about 12 hours. This approach to annealing has been shown to yield excellent single crystal silicon from amorphous silicon. However, the 12 hour duration of the conventional annealing process poses a significant temporal bottleneck to the efficient fabrication of semiconductor devices. Yet, shorter durations run the risk of yielding poor quality single crystal silicon.

SUMMARY OF THE INVENTION

In one embodiment, the invention provides a method of fabricating a semiconductor device using selective epitaxial growth (SEG), the method comprising; forming a seed window exposing a portion of a substrate through an interlayer insulating layer, growing a single crystal silicon SEG layer in the seed window using the exposed portion of the substrate as a seed, depositing an amorphous silicon layer on the interlayer insulating layer and in contact with the SEG layer, and performing an annealing process on the amorphous silicon layer over an annealing interval, and during the annealing interval applying microwave energy to the amorphous silicon layer.

In another embodiment, the invention provides a method of fabricating a semiconductor device comprising a first transistor and a second transistor vertically stacked above the first transistor, the method comprising; forming the first transistor gate structure associated with the first transistor on a silicon substrate, forming an interlayer insulating layer on the first gate structure, forming a seed-window through the interlayer insulting layer to expose a portion of the substrate, performing a selective epitaxial growth (SEG) process on the substrate to form a single crystal silicon SEG layer up through the seed window using the exposed portion of the substrate as a seed, depositing an amorphous silicon layer on the interlayer insulating layer and in contact with the SEG layer, performing an annealing process on the amorphous silicon layer over an annealing interval, and during the annealing interval applying microwave energy to the amorphous silicon layer to form a single crystal silicon layer from the amorphous silicon layer, and forming a second transistor gate structure associated with the second transistor from the single crystal silicon layer.

DESCRIPTION OF EXEMPLARY EMBODIMENTS

Embodiments of the invention will now be described with reference to the accompanying drawings. However, the invention should not be construed as being limited to only the embodiments set forth herein. Rather, the embodiments are presented as teaching examples. The invention may be variously embodied and its scope is defined by the claims that follow.

The term "on" is used to describe material layer and element relationships that are directly in contact or where one layer/element is formed on another with intervening layer(s)/element(s) being present.

One embodiment of the invention uses a selective epitaxial growth (SEG) process to form an epitaxial layer on a desired region of a semiconductor substrate. During the SEG process, however, microwave energy is applied during a constituent annealing process in order to reduce the process time otherwise required to convert amorphous silicon layer into a single crystal silicon. Despite the reduced process time of this approach, the resulting single crystal silicon has excellent material properties.

As noted above, the annealing process is performed to weaken the bonding force between silicon atoms. Microwave energy may be applied as a radio wave having a frequency ranging from between about 300 to 30,000 MHz and a wavelength of 1.0 m or less. Microwave energy may be accurately directed and may thus be used to selectively activate atoms in a material layer.

In the exemplary embodiment of the invention, microwave energy is used to initiate vibration of silicon atoms in an amorphous silicon layer. This vibration effect serves to weaken the bonding force between silicon atoms and thus facilitates the conversion of the amorphous silicon layer into a single crystal silicon layer. In one aspect, the application of microwave energy is made during the annealing process such that bonding force between silicon atoms is simultaneously assaulted by thermal energy and microwave energy. In this manner, a selective epitaxial layer may be formed by embodiments of the invention during a time interval much reduced over the conventional technique using only an annealing process.

An exemplary method of fabricating a semiconductor device drawn to a single stack layer structure and using SEG in accordance with an embodiment of the invention will be described with reference to FIGS. 3A to 3D.

Figure 1A:
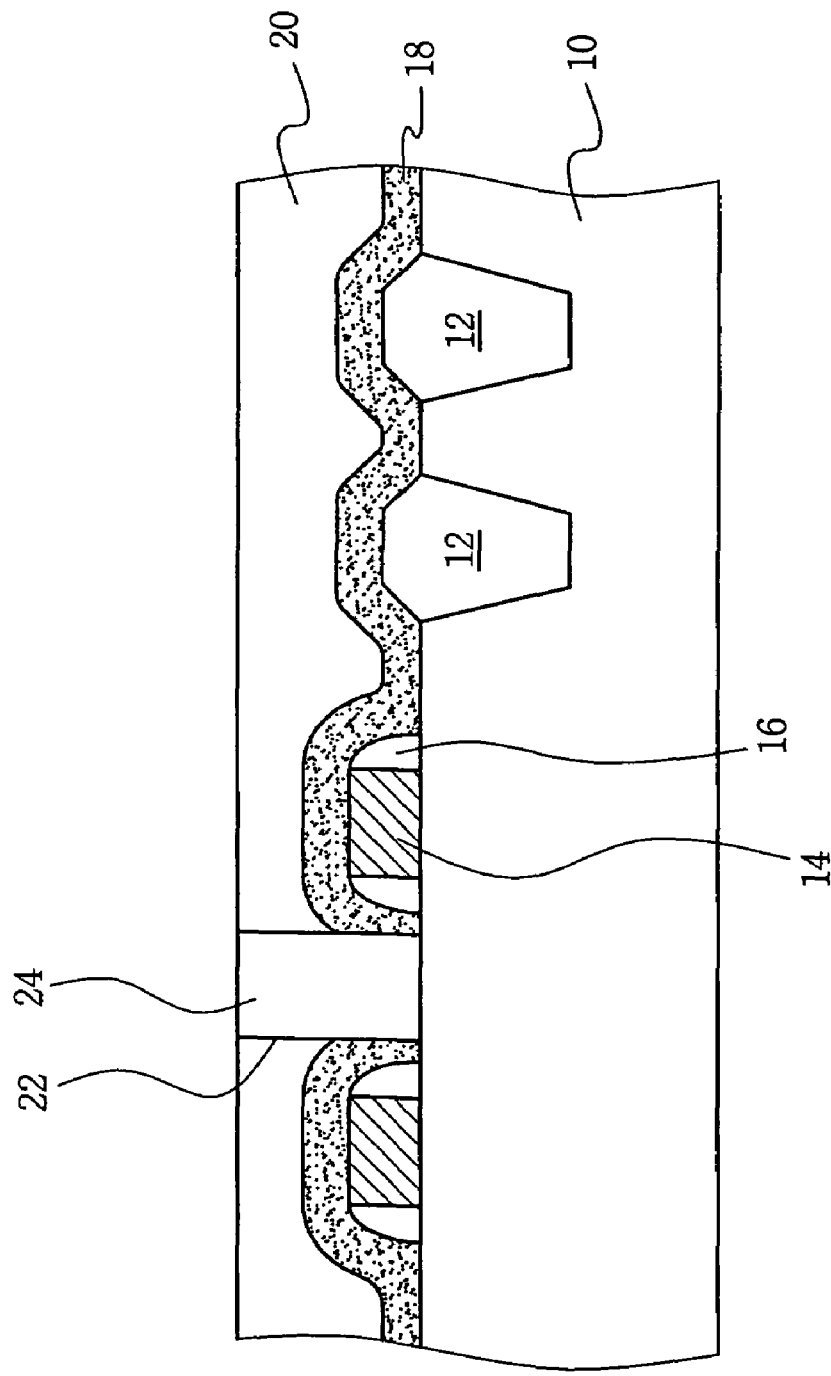
FIGS. 1A to 1C are cross-sectional views illustrating a conventional method of fabricating a semiconductor device having a single stack layer using SEG.
Figure 1B:
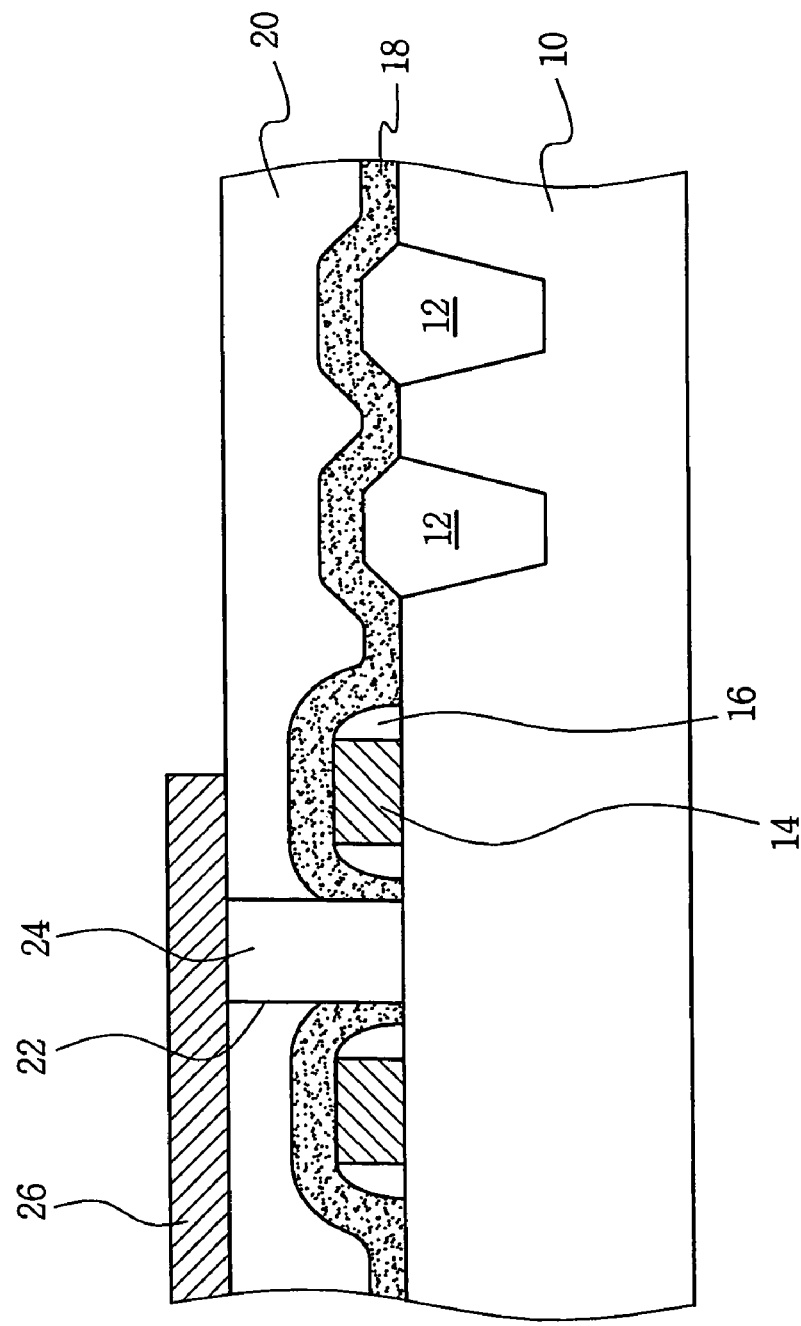
Figure 1C:
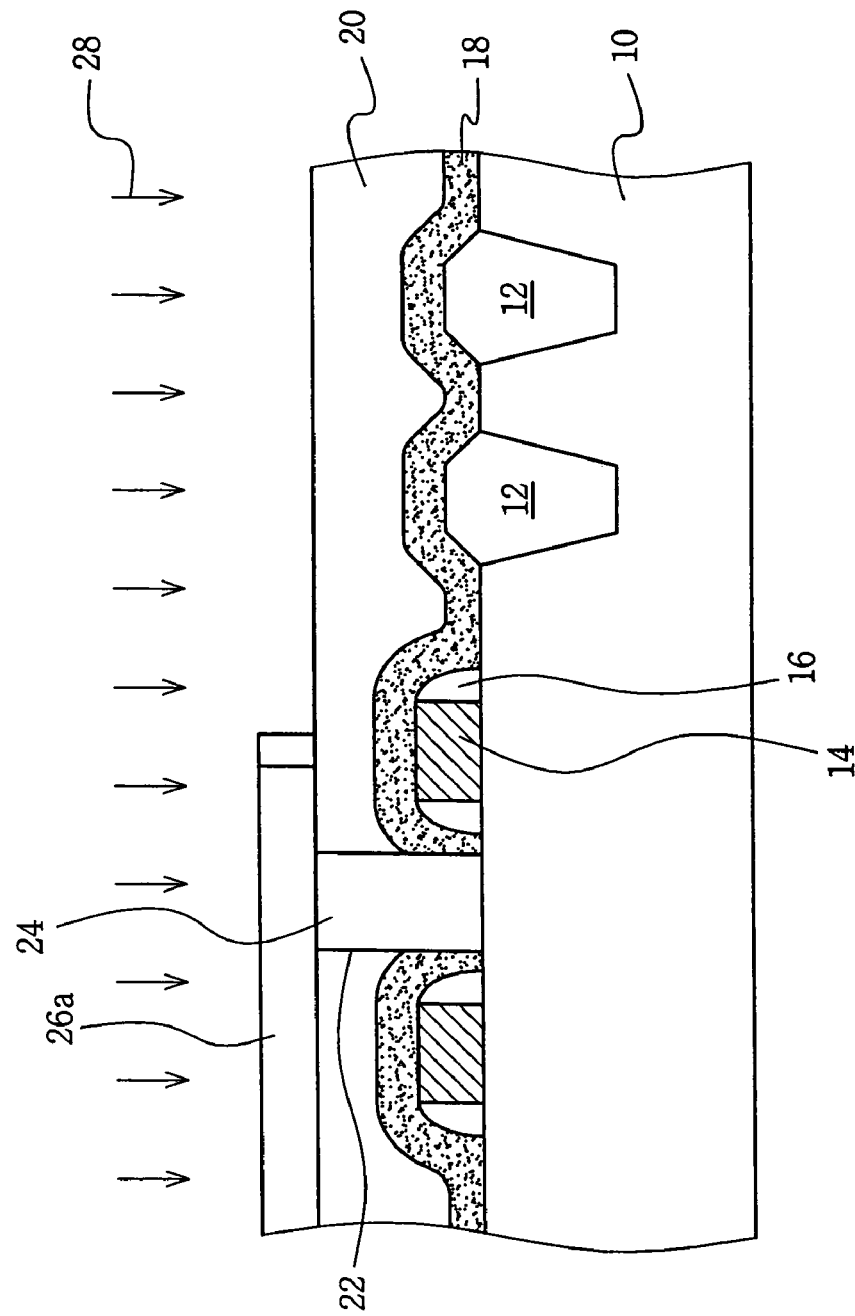
Figure 2A:
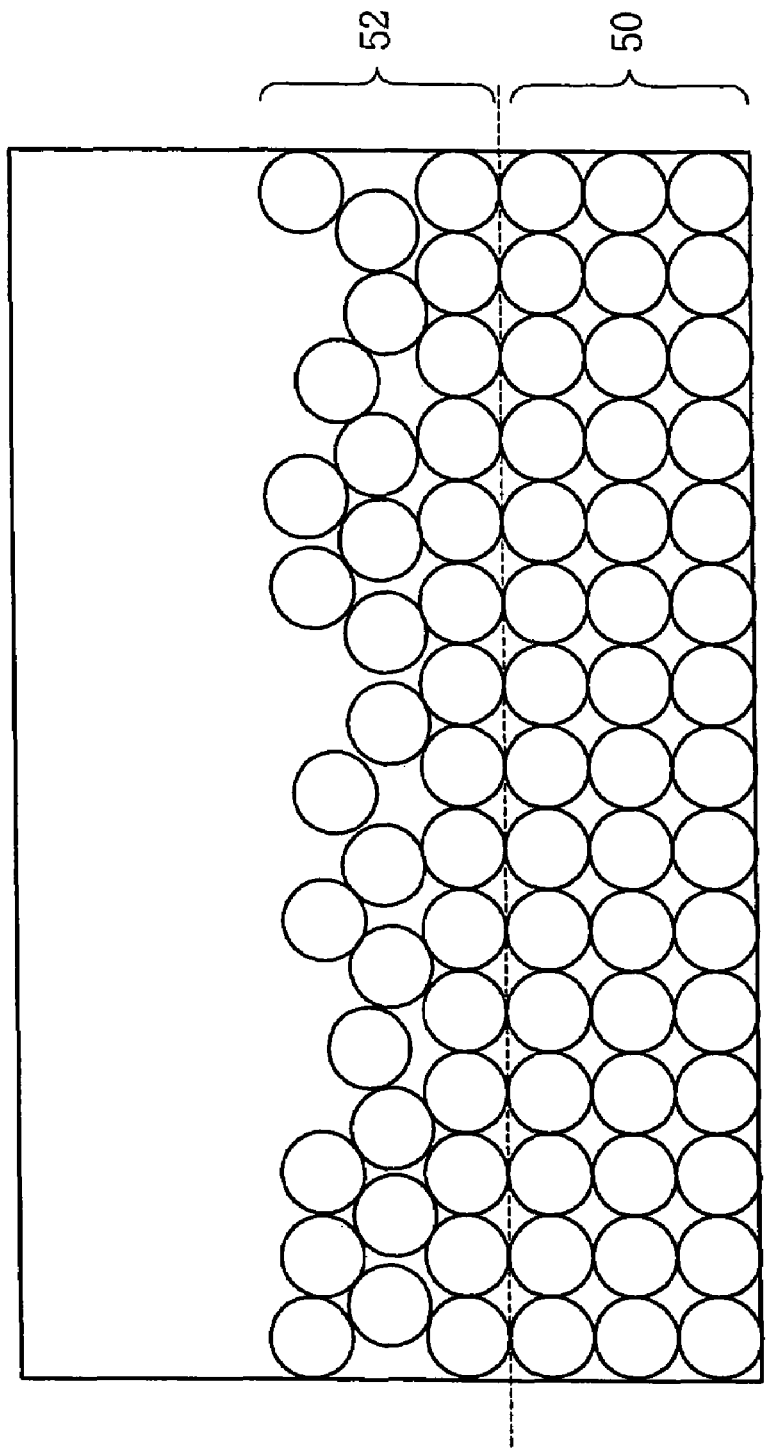
FIGS. 2A to 2C are schematic diagrams illustrating a process in which amorphous silicon is converted into single crystal silicon by an annealing process.
Figure 2B:
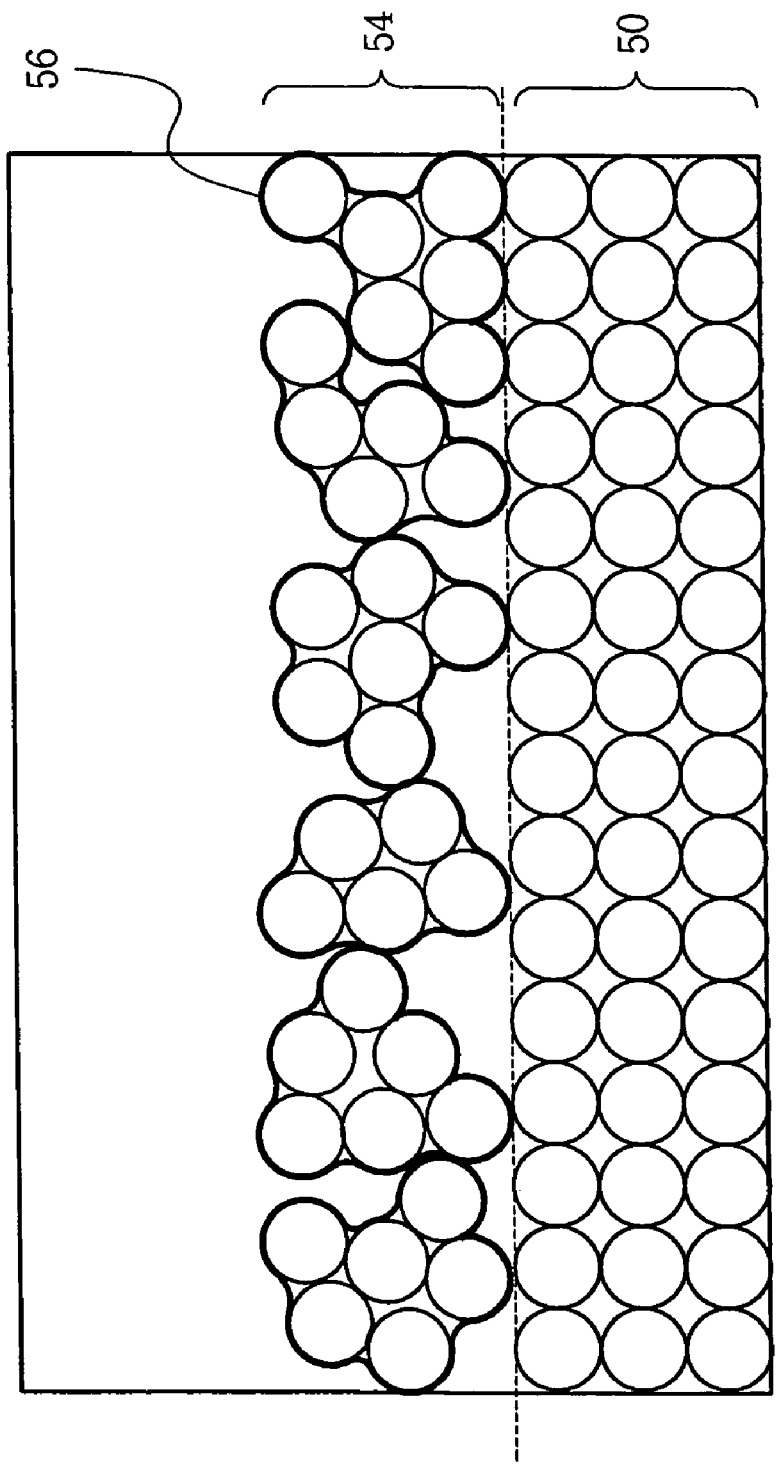
Figure 2C:
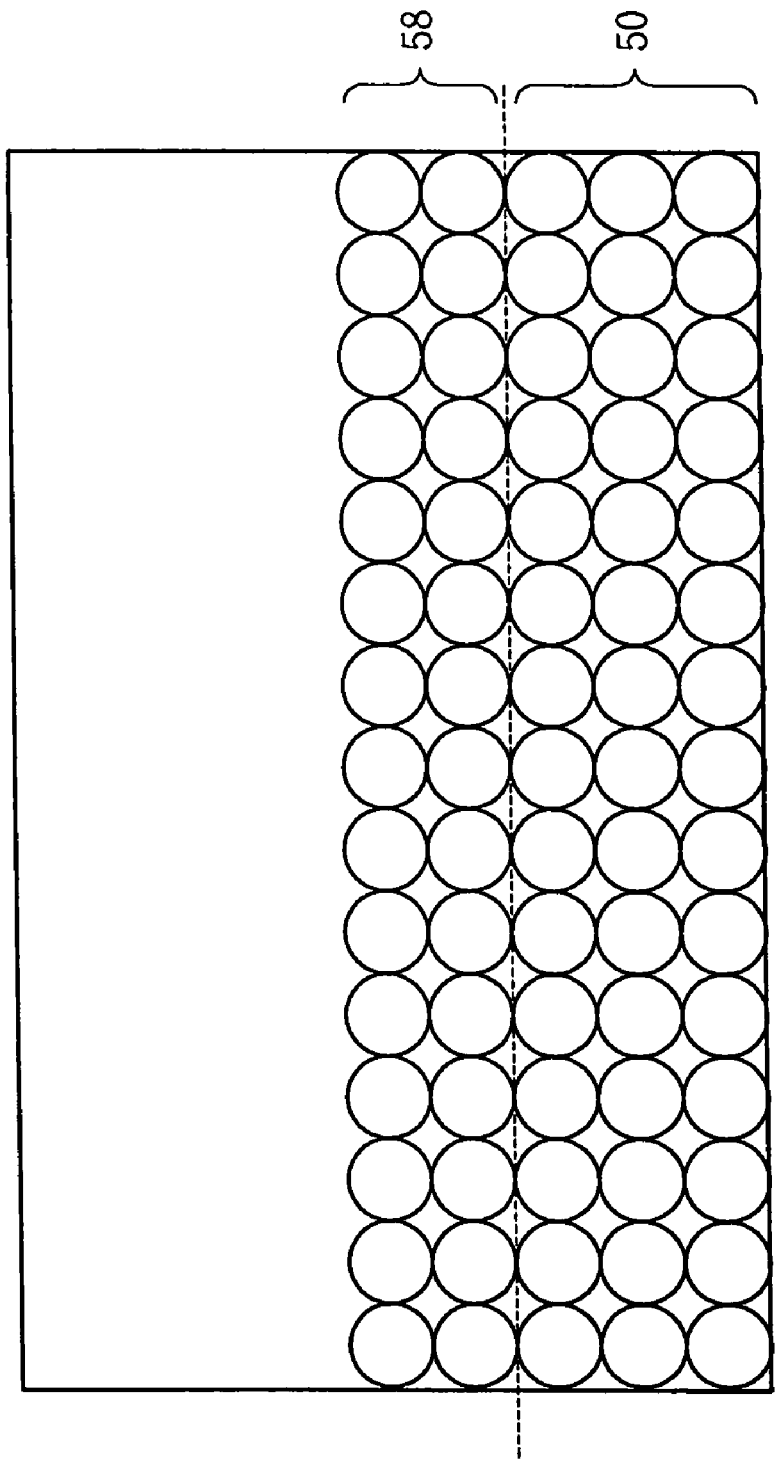
Figure 3A:
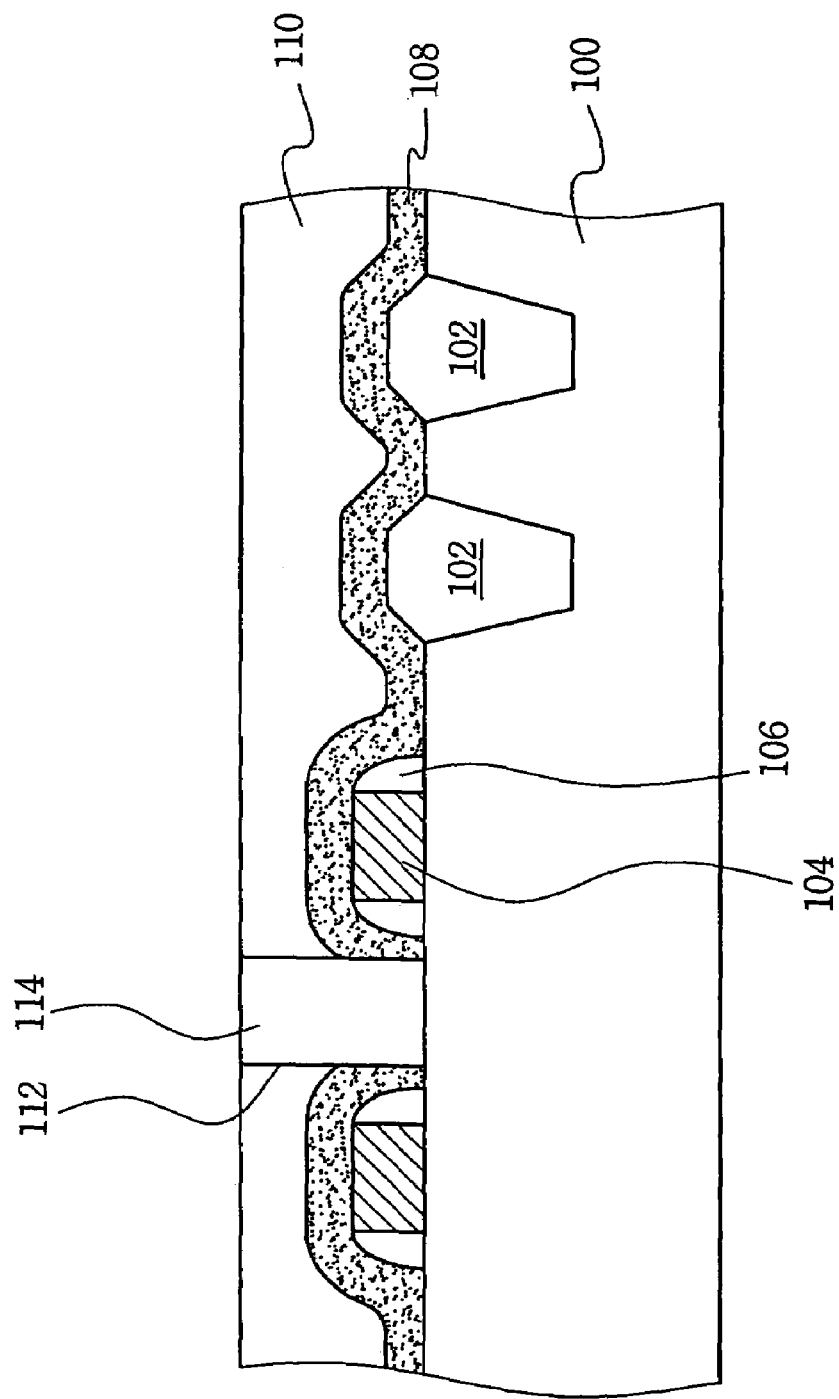
FIGS. 3A to 3D are cross-sectional views illustrating a method of fabricating a semiconductor device having a single stack layer using SEG in accordance with an embodiment of the present invention.

Referring to FIG. 3A, a semiconductor substrate 100, for example of P type, comprises active and field regions defined by trench isolation layers 102, and a gate region 104 having sidewall spacers 106. Source and drain regions are conventionally formed in semiconductor substrate 100 relative to gate region 104.

Subsequently, a buffer layer 108 (e.g., silicon nitride and an oxide layer 110 (e.g., a high temperature oxide) are sequentially deposited on semiconductor substrate 100 to thicknesses of about 200 Å and 600 Å, respectively to form an interlayer insulating layer. Then, a seed window 112 is formed through the interlayer insulating layer using a conventional photo-lithography process to expose, for example, a source or drain region in semiconductor substrate 100. Semiconductor substrate 100 is then subjected to an SEG process at a pressure ranging between about 5 to 200 Torr and at a temperature ranging from between about 700 to 750° C. A SEG layer 114 is thus grown from the exposed portion of semiconductor substrate 100 acting as a seed up through seed window 112.

Figure 3B:
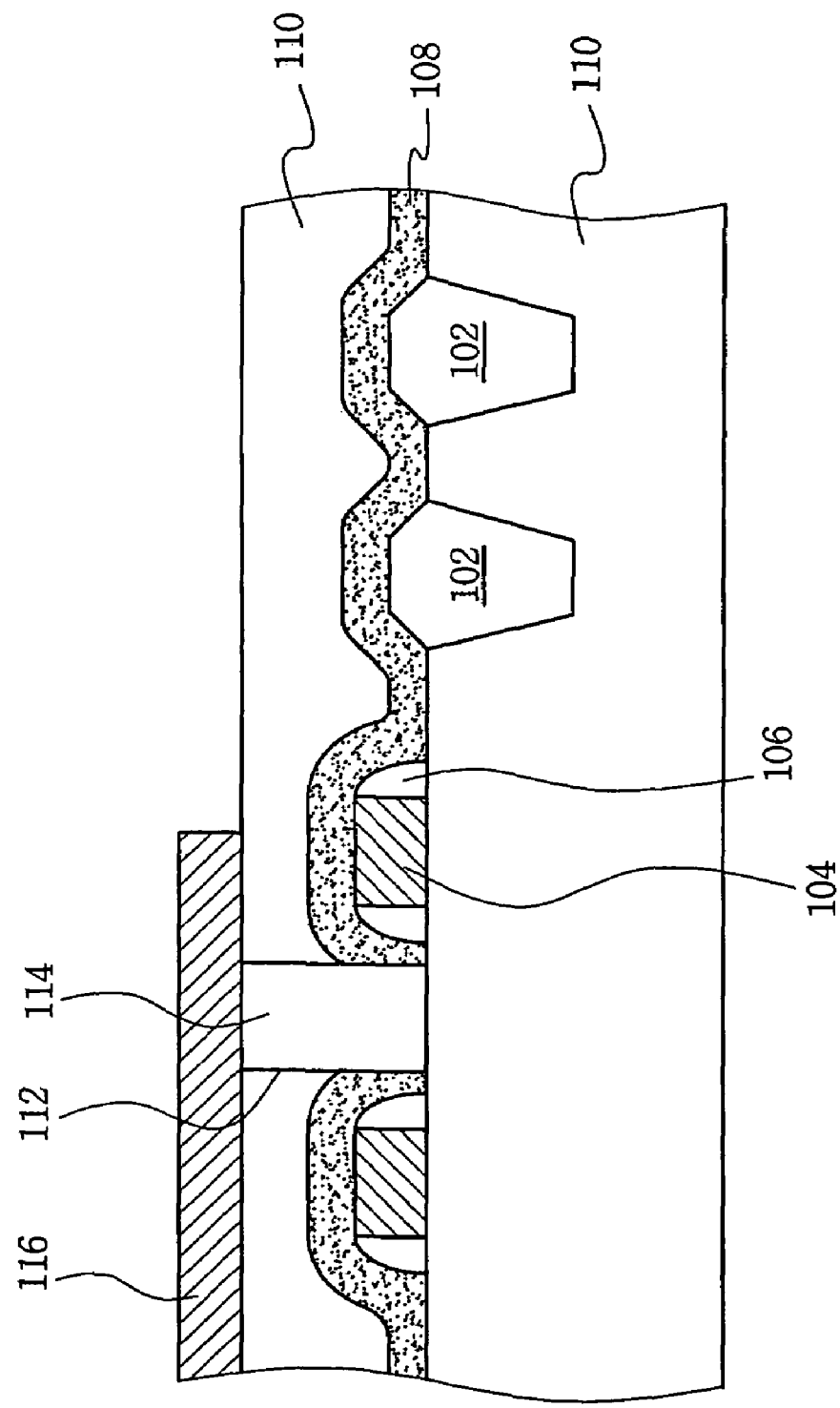

Referring now to FIG. 3B, to continue the SEG process associated with selective epitaxial layer 114, an amorphous silicon layer is deposited and patterned on semiconductor substrate 100 in contact SEG layer 114 to form into a channel silicon pattern 116 having a thickness of about 250 Å.

In the illustrated example, channel silicon pattern 116 defines a region ultimately serving as a gate region of an upper transistor formed along a common vertical axis as a lower transistor associated with gate region 104.

Figure 3C:
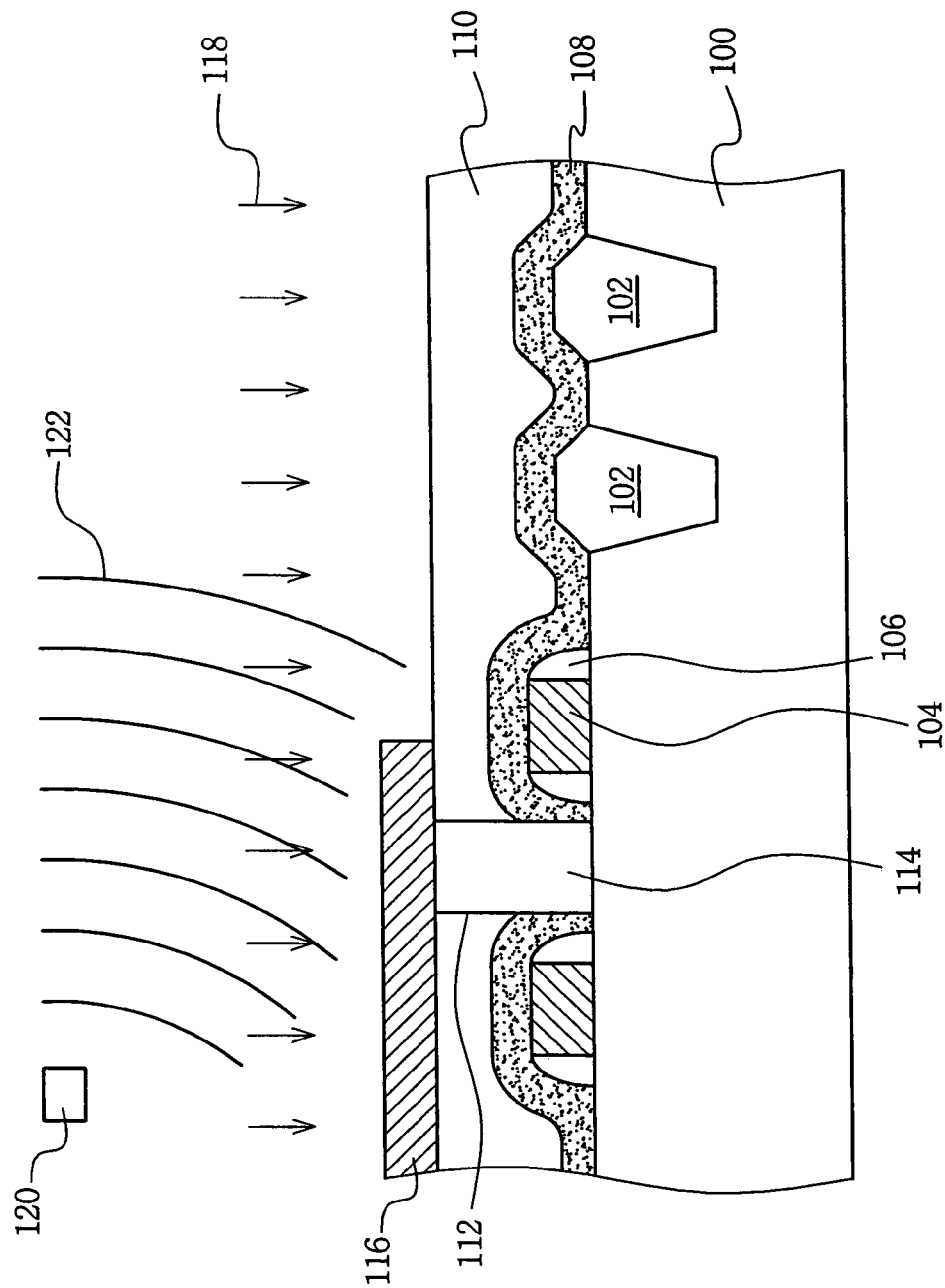
Figure 3D:
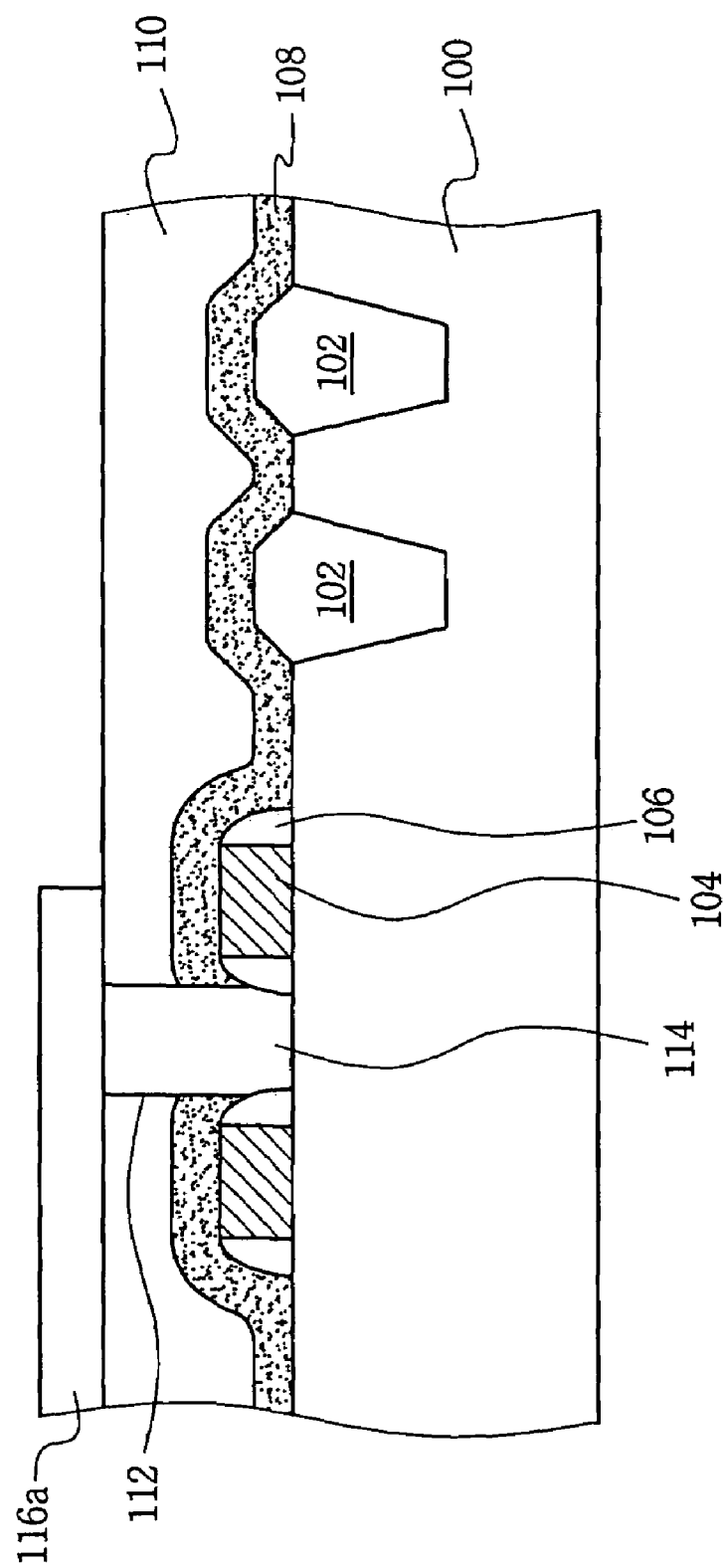

Referring to FIG. 3C, an annealing process 118 is performed on semiconductor substrate 100. In one embodiment of the invention, annealing process 118 is carried out at a temperature ranging from about 500 to 700° C. for an annealing interval of less than 12 hours. In one more particular embodiment, annealing process 118 is carried at a temperature of about 600° C. for an interval ranging from about 2 to 4 hours. During at least some portion annealing process 118, microwave energy 122 is directionally applied using a microwave generator 120. Microwave energy 122 serves not only to facilitate vibration of the silicon atoms between which a bonding force is weakened by the annealing process, but also allow the silicon atoms to move in relation to its applied direction.

As a result of annealing process 28 and with SEG 114 acting as a seed, the amorphous silicon forming channel silicon pattern 116 is ultimately converted into a single crystal silicon layer 116a. See, FIG. 3D. Thus, single crystal silicon layer 116a is materially similar to SEG layer 114 and possesses excellent material properties despite having been formed during a reduced time interval.

In a related aspect, microwave energy 122 may be amplitude adjusted in view of the crystal orientation of the target silicon atoms. Using diamond structure silicon as an example, the amplitude of microwave energy 122 may be controlled so as to allow the silicon atoms to be vibrated by a distance of "a" in the <100> direction, by a distance of $$"\frac{a}{\sqrt{2}}"$$

in the <110> direction, and by a distance of $$"\frac{\sqrt{3}\,a}{4}" \text{ and } "\frac{3\sqrt{3}\,a}{4}"$$

in the <111> direction

Once single crystal silicon layer 116a is formed, a gate region having sidewall spacers, as well as doped diffusion regions functioning as source and drain may be formed to complete the upper transistor in the single stack layer structure of the illustrated example.

In the foregoing exemplary manner, embodiments of the invention provide a method of fabricating a semiconductor device using selective epitaxial growth capable of significantly reducing the overall fabrication time. The reliability of SEG layers formed through the foregoing exemplary methods are not compromised in their material nature despite the greatly reduced fabrication time.

The invention has been described in the context of exemplary embodiments. However, it is to be understood that the scope of the invention is not limited to only the disclosed embodiments. On the contrary, the scope of the invention is intended to include various modifications and alternative arrangements. The scope of the claims to follow should be accorded the broadest interpretation so as to encompass all such modifications and similar arrangements.

What is claimed is:

1. A method of fabricating a semiconductor device using selective epitaxial growth (SEG), the method comprising:
    forming a seed window exposing a portion of a substrate through an interlayer insulating layer;
    growing a single crystal silicon SEG layer in the seed window using the exposed portion of the substrate as a seed;
    depositing an amorphous silicon layer on the interlayer insulating layer and in contact with the SEG layer; and
    performing an annealing process on the amorphous silicon layer over an annealing interval, and during the annealing interval applying microwave energy to the amorphous silicon layer.

2. The method of claim 1, wherein the annealing process is performed at a temperature ranging from about 500 to 700° C. and the annealing interval is less than 12 hours.

3. The method of claim 2, wherein the temperature is about 600° C.

4. The method of claim 2, wherein the annealing interval ranges from between about 2 to 4 hours.

5. The method of claim 1, wherein the microwave energy has an amplitude controlled in relation to a distance separating neighboring silicon atoms in the SEG layer.

6. The method of claim 1, wherein the microwave energy is directionally applied to the amorphous silicon layer.

7. The method of claim 6, wherein the microwave energy is directionally applied in relation to a crystalline orientation related to the SEG layer.

8. A method of fabricating a semiconductor device comprising a first transistor and a second transistor vertically stacked above the first transistor, the method comprising:
    forming the first transistor gate structure associated with the first transistor on a silicon substrate;
    forming an interlayer insulating layer on the first gate structure;
    forming a seed window through the interlayer insulating layer to expose a portion of the substrate;
    performing a selective epitaxial growth (SEG) process on the substrate to form a single crystal silicon SEG layer up through the seed window using the exposed portion of the substrate as a seed;
    depositing an amorphous silicon layer on the interlayer insulating layer and in contact with the SEG layer;
    performing an annealing process on the amorphous silicon layer over an annealing interval, and during the annealing interval applying microwave energy to the amorphous silicon layer to form a single crystal silicon layer from the amorphous silicon layer; and,
    forming a second transistor gate structure associated with the second transistor from the single crystal silicon layer.

9. The method of claim 8, wherein the annealing process is performed at a temperature ranging from about 500 to 700° C. and the annealing interval is less than 12 hours.

10. The method of claim 9, wherein the temperature is about 600° C.

11. The method of claim 9, wherein the annealing interval ranges from between about 2 to 4 hours.

12. The method of claim 8, wherein the microwave energy has an amplitude controlled in relation to a distance separating neighboring silicon atoms in the SEG layer.

13. The method of claim 8, wherein the microwave energy is directionally applied to the amorphous silicon layer.

14. The method of claim 13, wherein the microwave energy is directionally applied in relation to a crystalline orientation related to the SEG layer.

* * * * *